United States Patent
Kim et al.

(10) Patent No.: US 7,501,297 B2
(45) Date of Patent: Mar. 10, 2009

(54) THIN FILM TRANSISTOR ARRAY PANEL AND MANUFACTURING METHOD THEREOF

(75) Inventors: Jang-Soo Kim, Gyeonggi-do (KR); Soo-Jin Kim, Gyeonggi-do (KR); Kyoung-Tai Han, Gyeonggi-do (KR); Hee-Hwan Choe, Incheon-si (KR); Joo-Han Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 458 days.

(21) Appl. No.: 11/336,087

(22) Filed: Jan. 20, 2006

(65) Prior Publication Data

US 2006/0160282 A1 Jul. 20, 2006

(30) Foreign Application Priority Data

Jan. 20, 2005 (KR) .................. 10-2005-0005306

(51) Int. Cl.
*H01L 21/00* (2006.01)

(52) U.S. Cl. .................. 438/30; 438/148; 438/149; 438/151; 438/157; 438/193; 438/283; 438/587; 438/FOR. 184; 438/FOR. 201

(58) Field of Classification Search .................. 438/30, 438/148, 149, 151, 157, 193, 283, 587, FOR. 201, 438/FOR. 184
See application file for complete search history.

(56) References Cited

U.S. PATENT DOCUMENTS 6,140,158 A 10/2000 Rhee et al.

2002/0021376 A1* 2/2002 Yoo et al. ................ 349/40
2004/0263757 A1* 12/2004 Kwon ................... 349/149

FOREIGN PATENT DOCUMENTS

| JP | 2004-212933 | 7/2004 |
|---|---|---|
| KR | 1019960042173 | 12/1996 |
| KR | 1020000001757 | 1/2000 |
| KR | 1020010045360 | 6/2001 |
| KR | 1020010083687 | 9/2001 |
| KR | 100436181 | 6/2004 |
| KR | 100443538 | 7/2004 |

* cited by examiner

*Primary Examiner*—Thanh V Pham
(74) *Attorney, Agent, or Firm*—MacPherson Kwok Chen & Heid LLP

(57) ABSTRACT

A method of manufacturing a thin film transistor array panel is provided, The method includes: forming a gate line on a substrate; forming a gate insulating layer on the gate line; forming a semiconductor layer on the gate insulating layer; forming a data line and a drain electrode on the semiconductor layer; depositing a passivation layer on the data line and the drain electrode; forming a photoresist including a first portion and a second portion thinner than the first portion on the passivation layer; etching the passivation layer using the photoresist as a mask to expose a portion of the drain electrode at least in part; removing the second portion of the photoresist; depositing a conductive film; and removing the photoresist to form a pixel electrode on the exposed portion of the drain electrode.

16 Claims, 13 Drawing Sheets

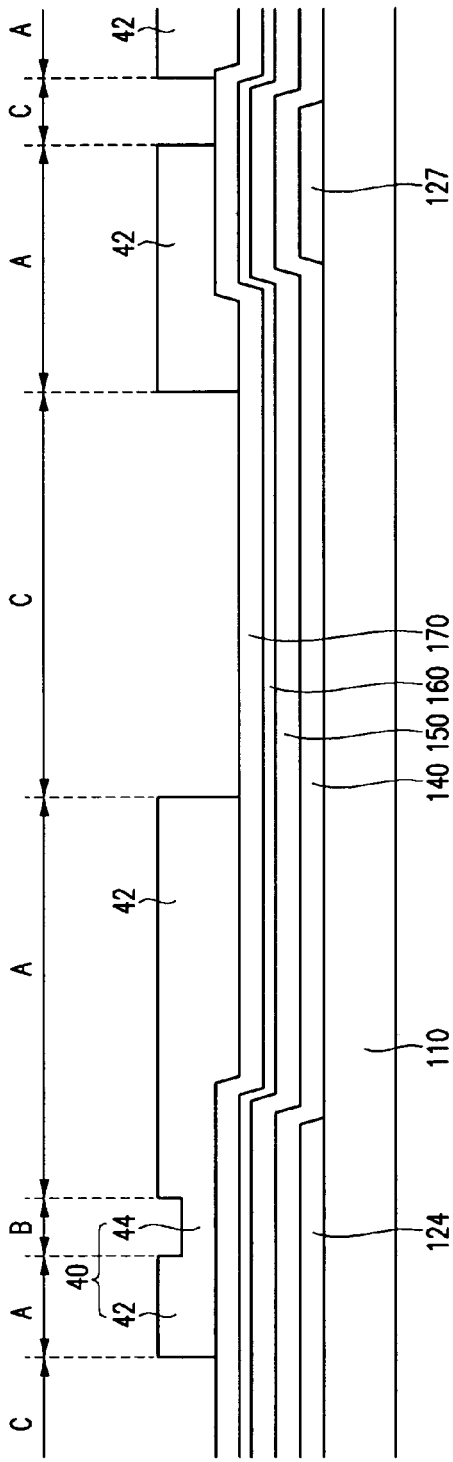
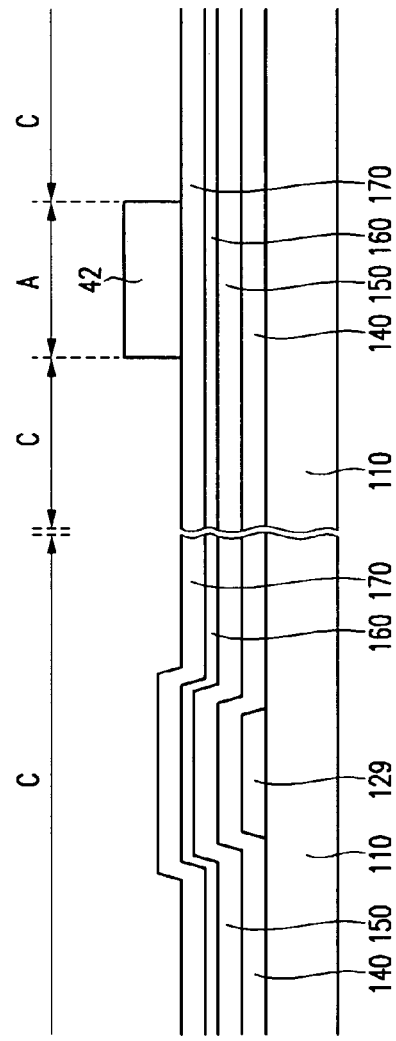

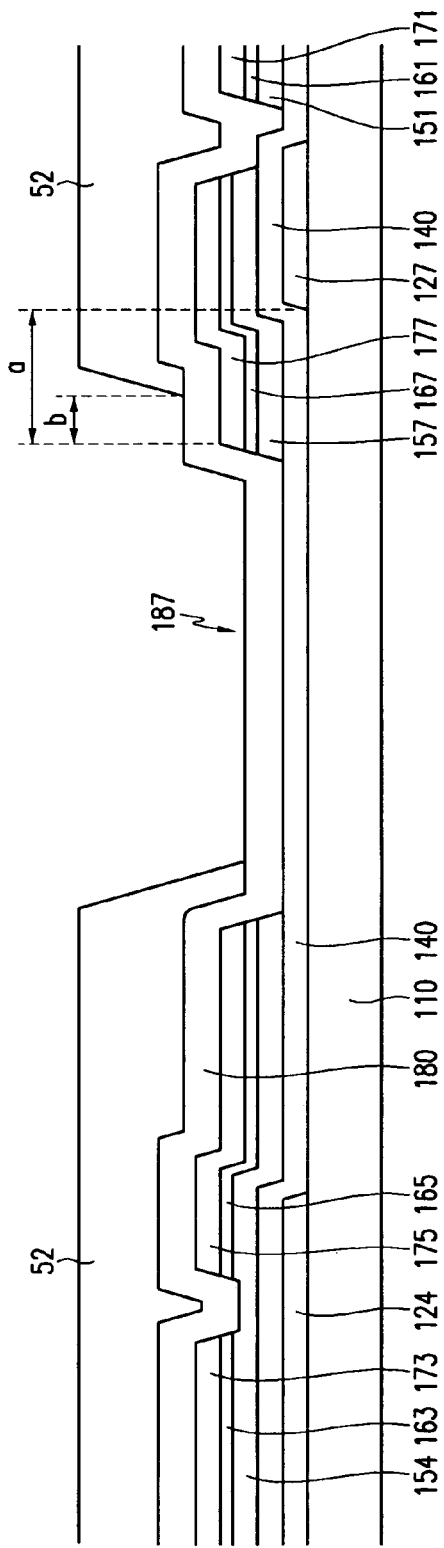
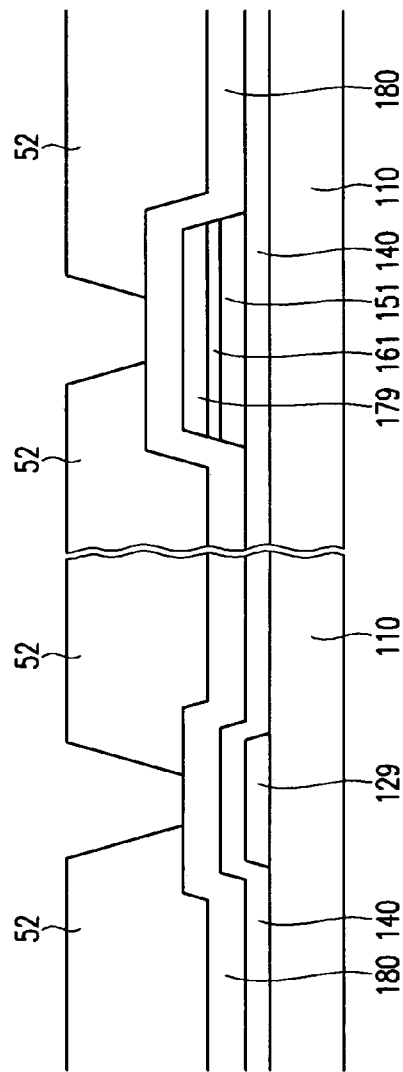

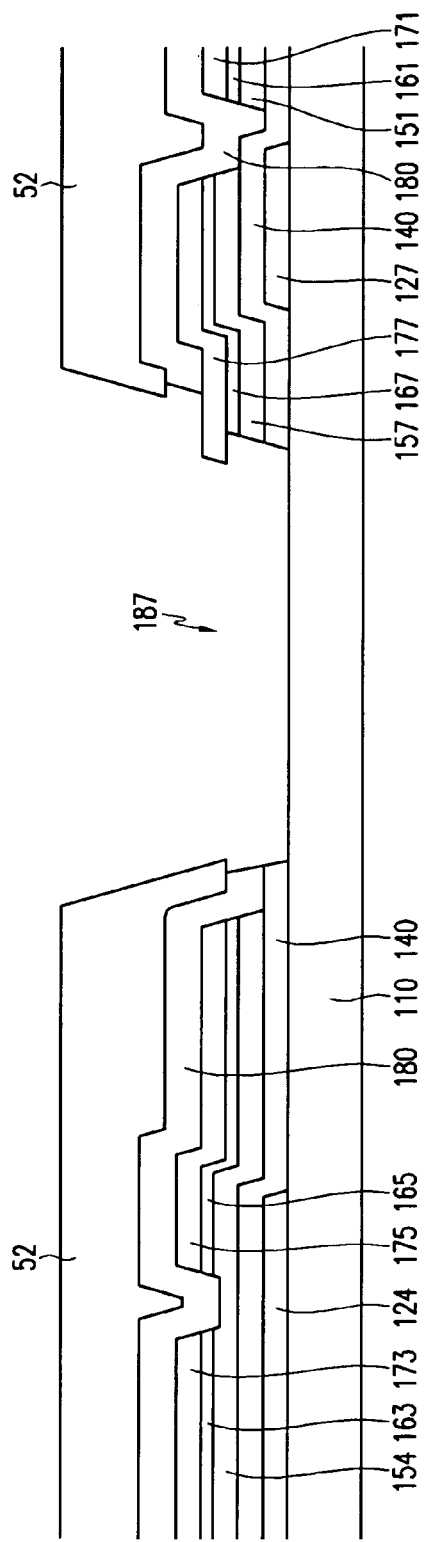
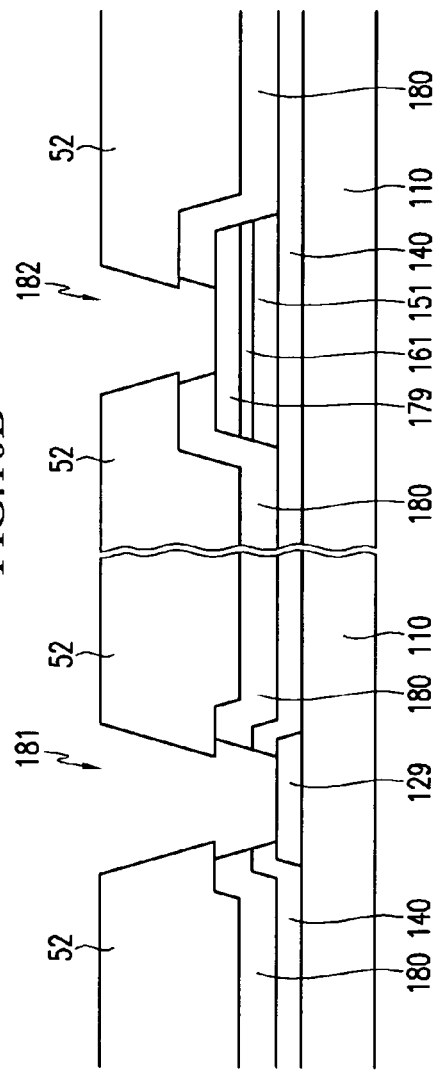

THIN FILM TRANSISTOR ARRAY PANEL AND MANUFACTURING METHOD THEREOF

CROSS REFERENCE TO RELATED APPLICATION

This application claims priority from Korean Patent Application No. 10-2005-0005306 filed on Jan. 20, 2005, the content of which is incorporated by reference herein in its entirety.

BACKGROUND OF THE INVENTION (a) Field of the Invention

The present invention relates to a thin film transistor array panel and a manufacturing method thereof.

(b) Description of Related Art

An active type of display device such as a liquid crystal display (LCD) and an organic light emitting display (OLED) includes a plurality of pixels arranged in a matrix, field generating electrodes, and switching elements. The switching elements include thin film transistors (TFTs) having three terminals: a gate, a source, and a drain. The TFT of each pixel selectively transmits data signals to the field-generating electrode in response to gate signals.

The display device further includes a plurality of signal lines for transmitting signals to the switching elements, which include gate lines transmitting gate signals and data lines transmitting data signals.

The LCD and the OLED include a panel provided with the TFTs, the field-generating electrodes, and the signal lines, which is referred to as a TFT array panel.

The TFT array panel has a layered structure that includes several conductive layers and insulating layers. The gate lines, the data lines, and the field-generating electrodes are formed of different conductive layers and are separated by insulating layers.

The TFT array panel having the layered structure is manufactured by several lithography steps and etching steps. Since lithography is expensive and time-consuming, it is desirable to reduce the number of lithography steps.

SUMMARY OF THE INVENTION

A motivation of the present invention is to solve the problems of the conventional techniques.

In an embodiment of the present invention, a method of manufacturing a thin film transistor array panel is provided. The method includes: forming a gate line on a substrate; forming a first insulating layer on the gate line; forming a semiconductor layer on the first insulating layer; forming a data line and a drain electrode on the semiconductor layer; depositing a passivation layer on the data line and the drain electrode; forming a photoresist on the passivation layer; etching the passivation layer and first insulating layer using the photoresist as a mask to expose portions of the drain electrode and at least a part of the substrate; partially removing a exposed portion of the drain electrode; depositing a conductive film; and removing the photoresist to form a pixel electrode connected to the exposed portion of the drain electrode.

The photoresist may be formed by using a photo mask including a light blocking area and a light transmitting area.

The removal of the drain electrode may be done by dry etching.

The removal of the drain electrode may use a $Cl_2/O_2$-containing gas.

The removal of the drain electrode may be done by wet etching.

The exposed portion of the drain electrode may have a length of at least 7.5 μm.

A distance between the gate line and the drain electrode may be at least 6 μm.

The exposed portion of the drain electrode may have an area range of 80 to 120 μm².

The etching of the passivation layer and the first insulating layer may generate an undercut region under the second and first insulating layers.

The formation of the data line and the drain electrode may include forming a storage capacitor conductor overlapping a portion of the gate line.

The conductive film formed on the photoresist may be lifted off.

The pixel electrode may be at least partially connected to the substrate.

The etch of the passivation layer and the first insulating layer may include: forming a first contact hole exposing an end portion of the data line; and forming a first contact assistant connected to the end portion of the data line through the first contact hole.

The etching of the passivation layer and the first insulating layer may include: forming a second contact hole exposing an end portion of the gate line; and forming a second contact assistant connected to the end portion of the gate line through the second contact hole.

The pixel electrode may be formed along with the first and second contact assistants.

The semiconductor layer, the data line, and the drain electrode may be formed in a single lithography step.

In a further embodiment of the present invention, a thin film transistor array panel is provided that includes: a gate line formed on a substrate; a gate insulating layer formed on the gate line; a semiconductor layer formed on the gate insulating layer; a data line, a drain electrode, and a storage capacitor conductor formed on the semiconductor; a passivation layer that is formed on the data line, a portion of the drain electrode, and a portion of the storage capacitor conductor; and a pixel electrode connected to the drain electrode that is not covered by the passivation layer, wherein a portion of the pixel electrode which is adjacent to the gate line is connected to the storage capacitor conductor on which the passivation layer is not formed in part.

The gate line may include a projection overlapping the portion of the storage capacitor conductor, and the portion of the pixel electrode is adjacent to the projection of the gate line.

The drain electrode or the storage capacitor conductor connected to the pixel electrode may have an area range of 80 to 120 μm².

The pixel electrode may be formed on a portion of the substrate.

BRIEF DESCRIPTION OF THE DRAWINGS

The present invention will become more apparent by describing embodiments thereof in detail with reference to the accompanying drawings, in which:

FIGS. 5A and 5B illustrate the step following the step shown in FIGS. 4A and 4B, where FIG. 5A is a sectional view of the TFT array panel shown in FIG. 3 taken along the line IVA-IVA' and FIG. 5B is a sectional view of the TFT array panel shown in FIG. 3 taken along the lines IVB-IVB' and IVB'-IVB";

FIG. 8A is a sectional view of the TFT array panel shown in FIG. 6 taken along the line VIIA-VIIA' and FIG. 8B is a sectional view of the TFT array panel shown in FIG. 6 taken along the lines VIIB-VIIB' and VIIB'-VIIB";

FIGS. 9A and 9B illustrate the step following the step shown in FIGS. 8A and 8B, where FIG. 9A is a sectional view of the TFT array panel shown in FIG. 6 taken along the line VIIA-VIIA' and FIG. 9B is a sectional view of the TFT array panel shown in FIG. 6 taken along the lines VIIB-VIIB' and VIIB'-VIIB";

FIGS. 10A and 10B illustrate the step following the step shown in FIGS. 9A and 9B, where FIG. 10A is a sectional view of the TFT array panel shown in FIG. 6 taken along the line VIIA-VIIA' and FIG. 10B is a sectional view of the TFT array panel shown in FIG. 6 taken along the lines VIIB-VIIB' and VIIB'-VIIB";

FIG. 11A is a sectional view of the TFT array panel shown in FIG. 6 taken along the line VIIA-VIIA' and FIG. 11B is a sectional view of the TFT array panel shown in FIG. 6 taken along the lines VIIB-VIIB' and VIIB'-VIIB"; FIG. 12A is a sectional view of the TFT array panel shown in FIG. 6 taken along the line VIIA-VIIA' and FIG. 12B is a sectional view of the TFT array panel shown in FIG. 6 taken along the lines VIIB-VIIB' and VIIB'-VIIB."

DETAILED DESCRIPTION OF EMBODIMENTS

Figure 1:
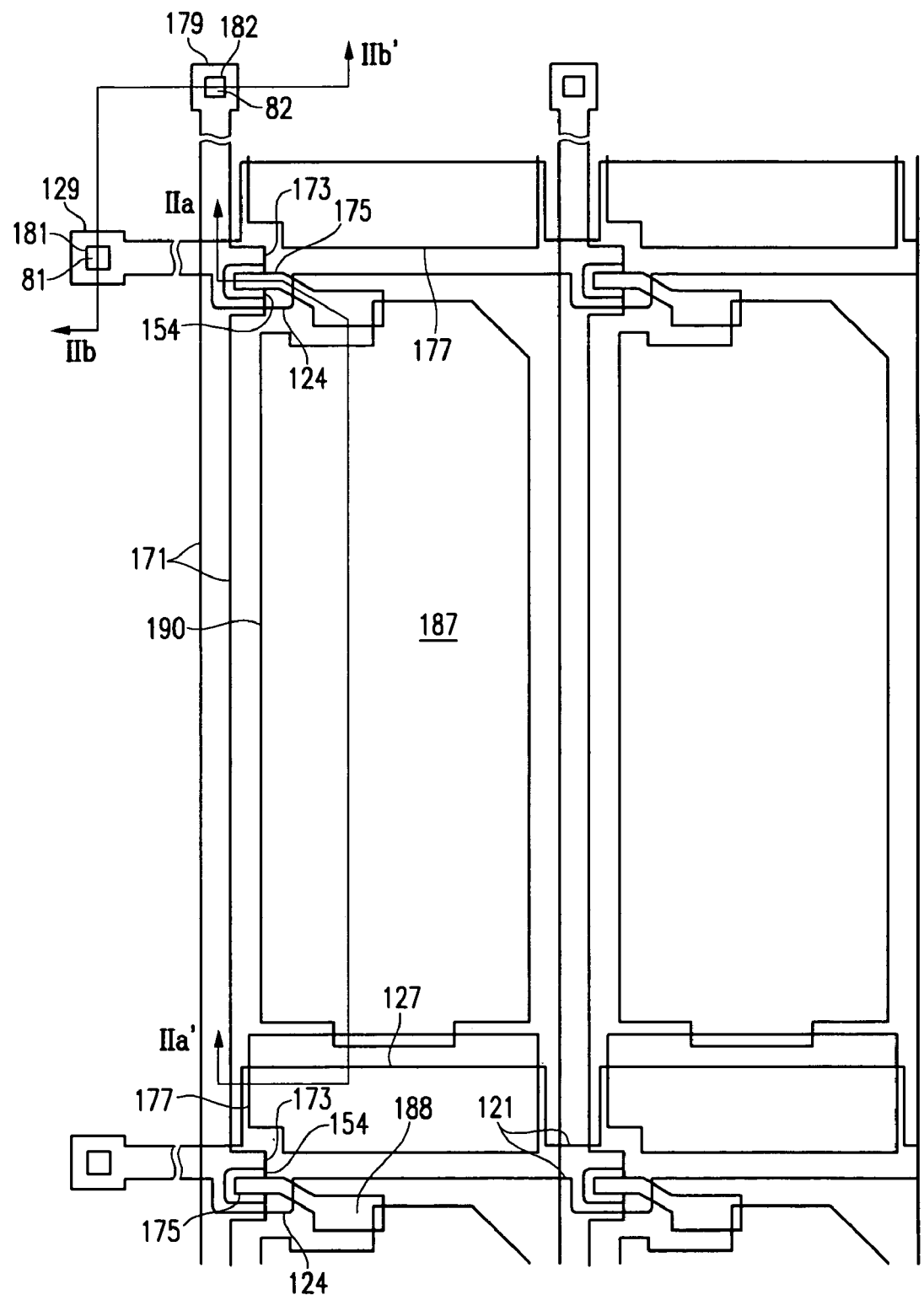
FIG. 1 is a layout view of a TFT array lower panel according to an embodiment of the present invention.

The present invention will be described more fully hereinafter with reference to the accompanying drawings, in which preferred embodiments of the invention are shown. This invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present.

TFTs and manufacturing methods thereof according to embodiments of the present invention will be described with reference to the accompanying drawings.

A TFT array panel according to an embodiment of the present invention will now be described in detail with reference to FIGS. 1, 2A and 2B.

Figure 2A:
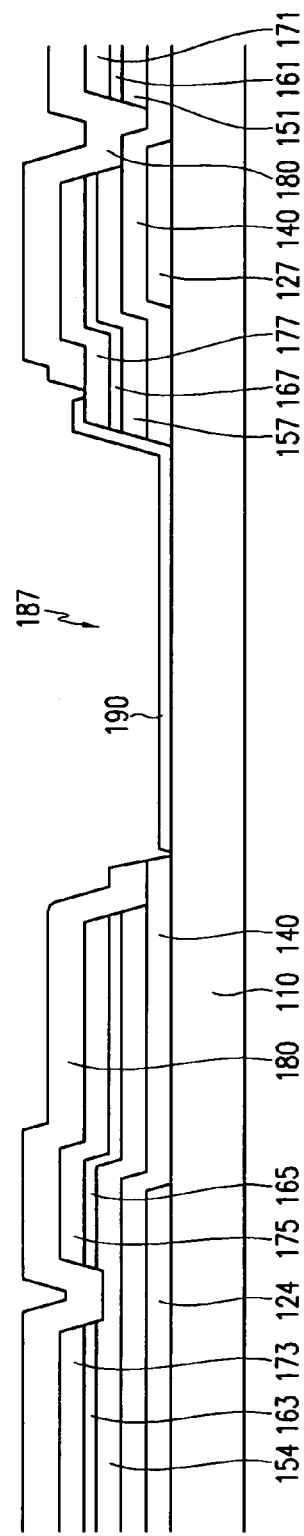
FIG. 2A is a sectional view of the TFT array panel shown in FIG. 1 taken along the line IIA-IIA'.
Figure 2B:
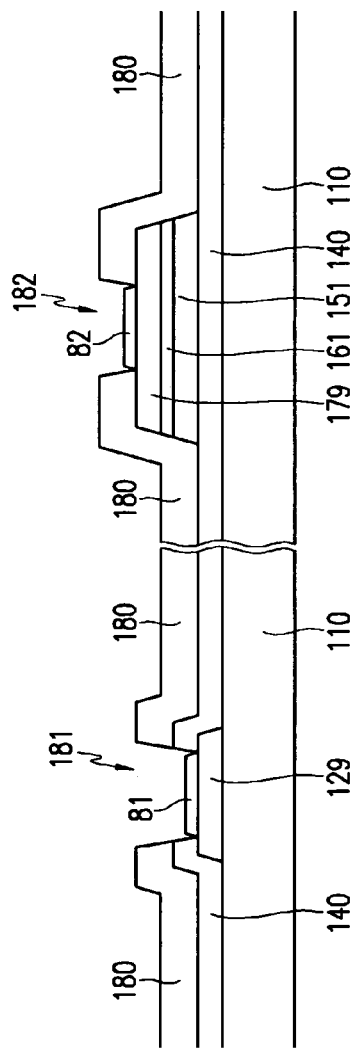
FIG. 2B is a sectional view of the TFT array panel shown in FIG. 1 taken along the lines IIB-IIB' and IIB'-IIB"

FIG. 1 is a layout view of a TFT array lower panel according to an embodiment of the present invention, FIG. 2A is a sectional view of the TFT array panel shown in FIG. 1 taken along the line IIA-IIA', and FIG. 2B is a sectional view of the TFT array panel shown in FIG. 1 taken along the lines IIB-IIB' and IIB'-IIB".

A plurality of gate lines 121 are formed on an insulating substrate 110, which may be transparent glass.

The gate lines 121 extend substantially in a first direction to transmit gate signals. Each gate line 121 includes a plurality of gate electrodes 124 and projections 127. Each gate line 121 further includes an end portion 129 having a large area for contact with another layer or a driving circuit. The gate lines 121 may extend to be connected to a driving circuit that may be integrated on the lower panel 100.

The gate lines 121 are preferably made of an Al-containing metal such as Al and an Al alloy, an Ag-containing metal such as Ag and an Ag alloy, a Cu-containing metal such as Cu and a Cu alloy, a Mo-containing metal such as Mo and a Mo alloy, Cr, Ti, or Ta. The gate lines 121 may have a multi-layered structure including two films having different physical characteristics. One of the two films is preferably made of a low-resistivity metal including an Al-containing metal, an Ag-containing metal, and a Cu-containing metal for reducing signal delay or voltage drop in the gate lines 121. The other film is preferably made of a material such as a Mo-containing metal, Cr, Ta, or Ti, which have good physical, chemical, and electrical contact characteristics with other materials such as indium tin oxide (ITO) and indium zinc oxide (IZO). Good examples of the combination of the two films are a lower Cr film and an upper Al (alloy) film, and a lower Al (alloy) film and an upper Mo (alloy) film. However, they may be made of various metals or conductors.

The lateral sides of the gate lines 121 are inclined relative to a surface of the substrate, and the inclination angle thereof ranges about 30-80 degrees.

A gate insulating layer 140 preferably made of silicon nitride (SiNx) is formed on the gate lines 121.

A plurality of semiconductor stripes and islands 151 and 157 preferably made of hydrogenated amorphous silicon (abbreviated to "a-Si") or polysilicon are formed on the gate insulating layer 140. Each semiconductor stripe 151 extends substantially in the second direction that is perpendicular to the first direction, and has a plurality of projections 154 branching out toward the gate electrodes 124. Each semiconductor island 157 is separated from the semiconductor stripe 151 and has approximately a rectangular shape.

A plurality of ohmic contact stripes and islands 161, 165, and 167 preferably made of silicide or n+ hydrogenated a-Si heavily doped with N-type impurities such as phosphorus are formed on the semiconductor stripes 151. Each ohmic contact stripe 161 has a plurality of projections 163, and the projections 163 and the ohmic contact islands 165 are located in pairs on the projections 154 of the semiconductor stripes 151. Each ohmic contact island 167 is located nearly on the semiconductor island 165.

The lateral sides of the semiconductor stripes and islands 151 and 157 and the ohmic contacts 161, 165, and 167 are inclined relative to a surface of the substrate 110 to form angles that are preferably in a range of about 30-80 degrees.

A plurality of data lines 171, a plurality of drain electrodes 175 separated from the data lines 171, and a plurality of storage capacitor conductors 177 are formed on the ohmic contacts 161 and 165.

The data lines 171 extend substantially in the second direction to transmit data voltages and intersect the gate lines 121. Each data line 171 includes an end portion 179 having a large area for contact with another layer or an external device and a plurality of source electrodes 173 projecting toward the gate electrodes 124.

Each drain electrode 175 has a wide end portion and a linear end portion. The wide end portion has a large area for contact with another layer, and the linear end portion is partly enclosed by a source electrode 173 that is curved.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

Each storage capacitor conductor 177 overlaps the projection 127 of the gate line 121.

The data lines 171, the drain electrodes 175, and the storage capacitor conductors 177 are preferably made of a refractory metal such as Cr, Mo, Ti, Ta, and alloys thereof. However, they may have a multilayered structure including a refractory metal film (not shown) and a low resistivity film (not shown). Good examples of the multi-layered structure are a double-layered structure including a lower Cr/Mo (alloy) film and an upper Al (alloy) film, and a triple-layered structure of a lower Mo (alloy) film, an intermediate Al (alloy) film, and an upper Mo (alloy) film.

Like the gate lines 121, the data lines 171, and the drain electrodes 175, the storage capacitor conductors 177 have inclined edge profiles that form angles in a range about 30-80 degrees with respect to the substrate 110.

The ohmic contacts 161, 165, and 167 are interposed only between the underlying semiconductor stripes and islands 151 and 157 and the overlying conductors 171 and 175 and storage capacitor conductors 177 thereon, and they reduce the contact resistance therebetween. The semiconductor stripes 151 have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175. The semiconductor islands 157 have almost the same planar shapes as the storage capacitor 177 and the underlying ohmic contacts 167.

A passivation layer 180 is formed on the data lines 171, the drain electrodes 175, the storage capacitor conductors 177, and the exposed portions of the semiconductor stripes 151. The passivation layer 180 is preferably made of an inorganic insulator such as silicon nitride or silicon oxide, a photosensitive organic material having a good flatness characteristic, or a low dielectric insulating material that has a dielectric constant lower than 4.0 such as a-Si:C:O and a-Si:O:F formed by plasma enhanced chemical vapor deposition (PECVD). The passivation layer 180 may have a double-layered structure including a lower inorganic film and an upper organic film so that it may take advantage of the organic film as well as protect the exposed portions of the semiconductor stripes 151.

The passivation layer 180 has a plurality of contact holes 182 exposing parts of the end portions 179 of the data lines. The passivation layer 180 and the gate insulating layer 140 have a plurality of contact holes 181 and openings 187 exposing parts of the end portions 129 of the gate lines 121 and areas approximately enclosed by the gate lines 121 and the data lines, respectively. Each opening 187 exposes a portion of the substrate 110.

A plurality of pixel electrodes 190 are formed in the openings 187, and a plurality of contact assistants 81 and 82 are formed in the contact holes 181 and 182. The pixel electrodes 190 and the contact assistants 81 and 82 are preferably made of a transparent conductor such as ITO and IZO, or a reflective conductor such as Ag and Al.

Boundaries of the pixel electrodes 190 and the contact assistants 81 and 82 are substantially equal to boundaries of the passivation layer 180.

The pixel electrodes 190 are physically and electrically connected to the drain electrodes 175 such that the pixel electrodes 190 receive the data voltages from the drain electrodes 175. The pixel electrodes 190 supplied with the data voltages generate electric fields in cooperation with a common electrode (not shown) supplied with a common voltage, and they determine the orientations of liquid crystal molecules (not shown) disposed between the two electrodes or yield currents in a light emitting layer (not shown) to emit light.

Concerning an LCD, a pixel electrode 190 and a common electrode form a capacitor called a "liquid crystal capacitor," which stores applied voltages after turn-off of the TFT. An additional capacitor called a "storage capacitor," which is connected in parallel to the liquid crystal capacitor, is provided for enhancing the voltage-storing capacity. The storage capacitors are implemented by overlapping the pixel electrodes 190 with the gate lines 121 adjacent thereto (called "previous gate lines"). The capacitances of the storage capacitors, i.e., the storage capacitances, are increased by providing the projections 127 at the gate lines 121 for increasing the overlapping areas and by providing the storage capacitor conductors 177, which are connected to the pixel electrodes 190 and overlap the projections 127, under the pixel electrodes 190 for decreasing the distance between the terminals.

The width of the contact assistants 81 and 82 are substantially equal to width of the base of the contact holes 181 and 182. The contact assistants 81 and 82 are connected to and cover the exposed parts of the end portions 129 of the gate lines 121 and the exposed parts of the end portions 179 of the data lines 171 through the contact holes 181 and 182, respectively. The contact assistants 81 and 82 protect the end portions 129 and 179 and complement the adhesion of the end portions 129 and 179 to external devices.

In the TFT array panel according to an embodiment of the present invention, the drain electrodes 175 and the storage capacitor conductors 177 formed under the passivation layer 180 are not undercut inward of the passivation layer 180, and only need connection to the pixel electrodes 190 and the contact assistants 81 and 82. Preferably, sizes of the contact areas of the drain electrodes 175 and the pixel electrodes 190 or the storage capacitor conductors 177 and the pixel electrodes 190 are about 80 to 120 $\mu m^2$, and are most preferably about 100 $\mu m^2$.

Now, a method of manufacturing the TFT array panel shown in FIGS. 1-2B according to an embodiment of the present invention will be described in detail with reference to FIGS. 3-12B as well as FIGS. 1-2B.

Figure 3:
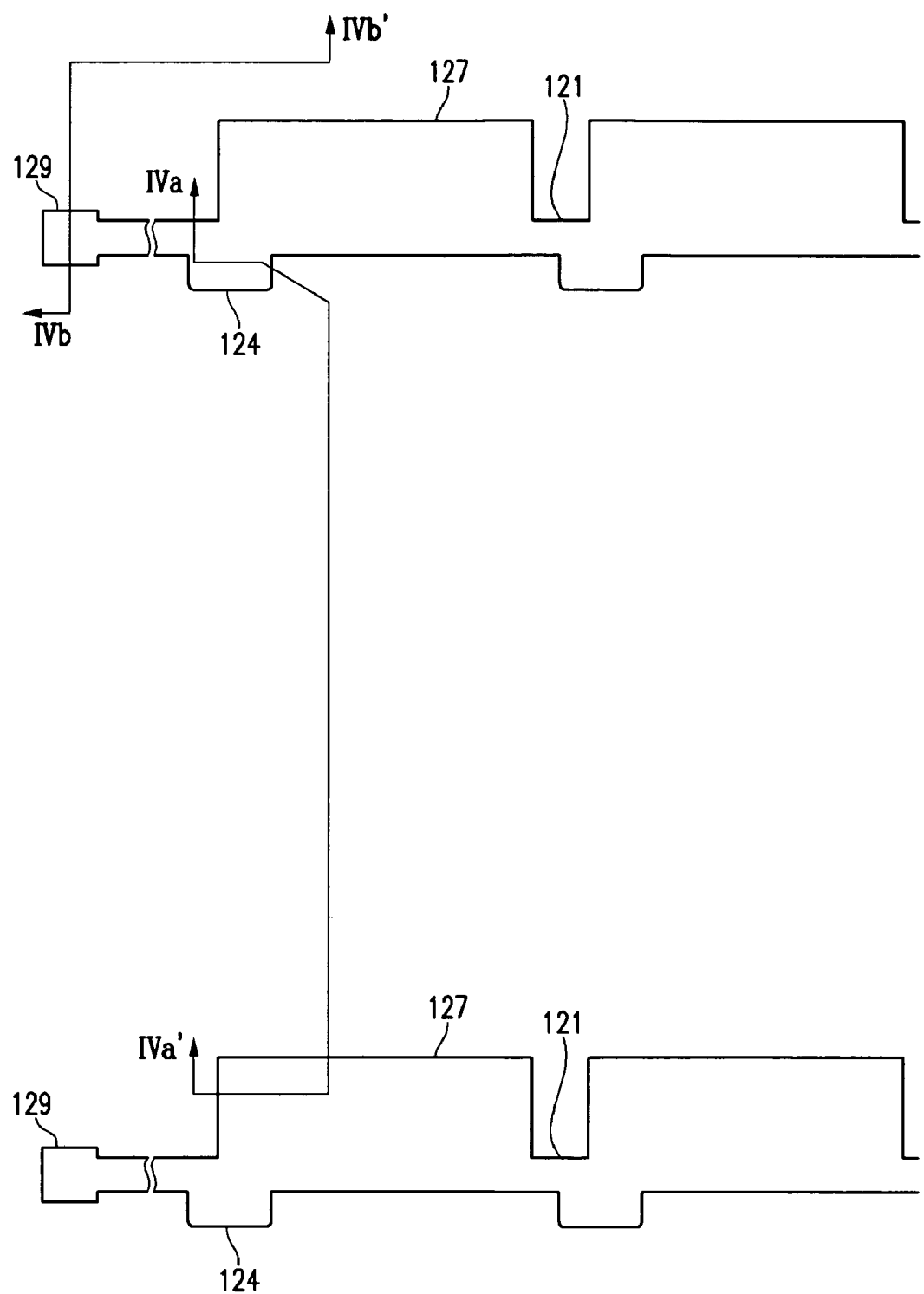
FIGS. 3 and 6 are layout views of a TFT array panel shown in FIGS. 1-2B in intermediate steps of a manufacturing method thereof according to an embodiment of the present invention.
Figure 4A:
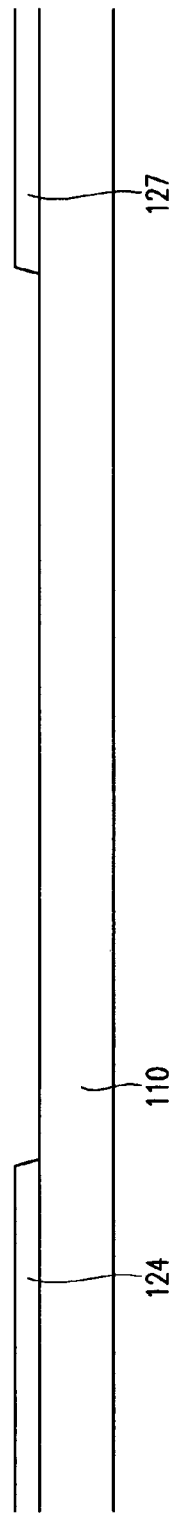
FIG. 4A is a sectional view of the TFT array panel shown in FIG. 3 taken along the line IVA-IVA'.
Figure 4B:
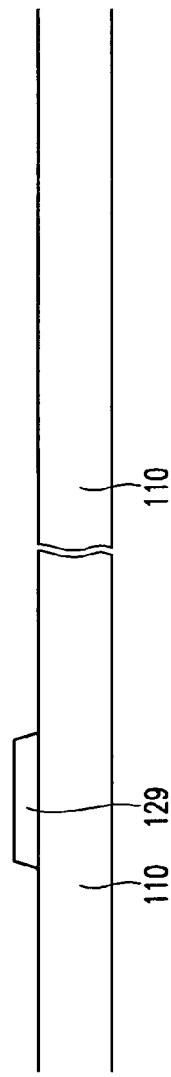
FIG. 4B is a sectional view of the TFT array panel shown in FIG. 3 taken along the lines IVB-IVB' and IVB'-IVB"
Figure 6:
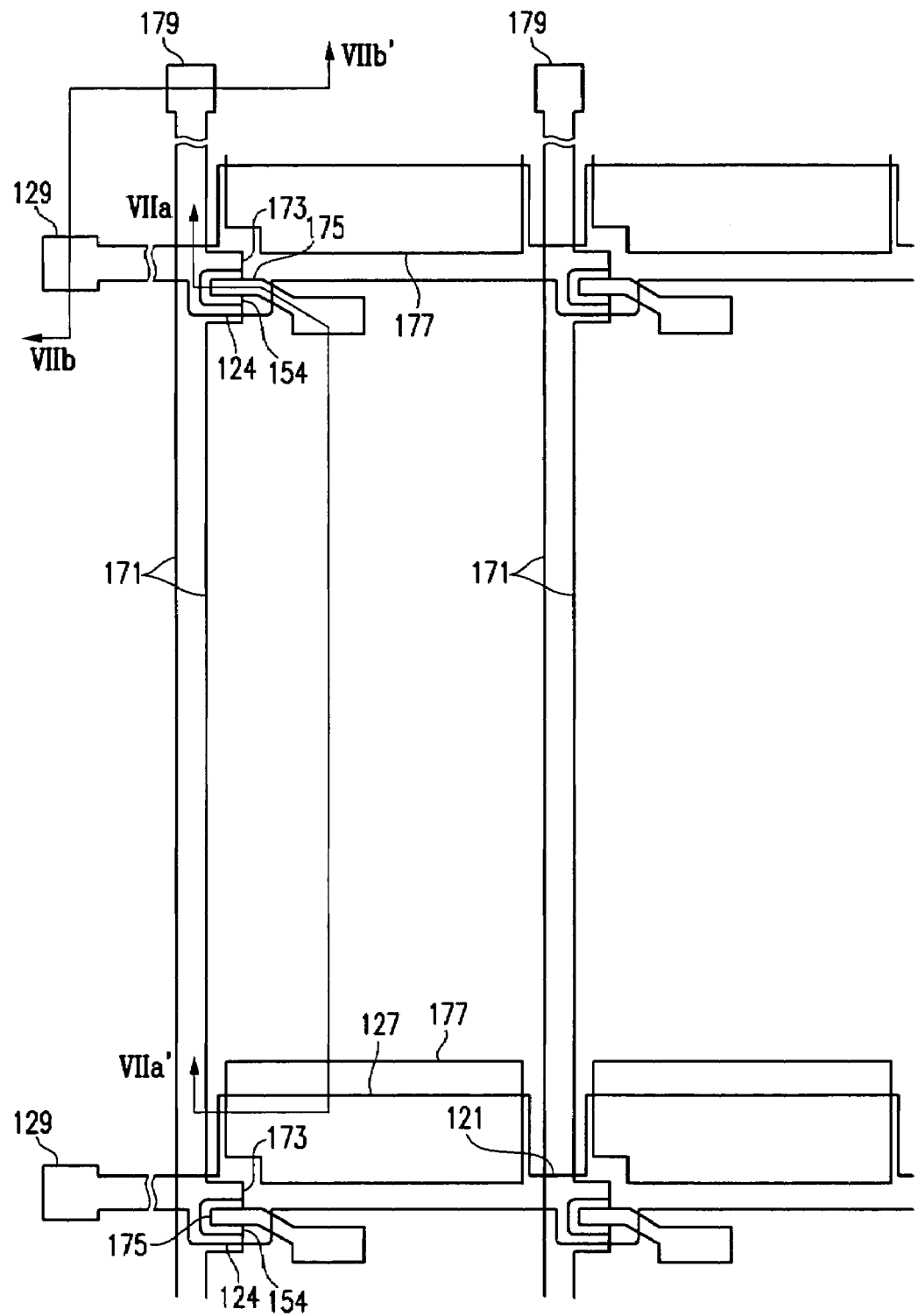
Figure 7A:
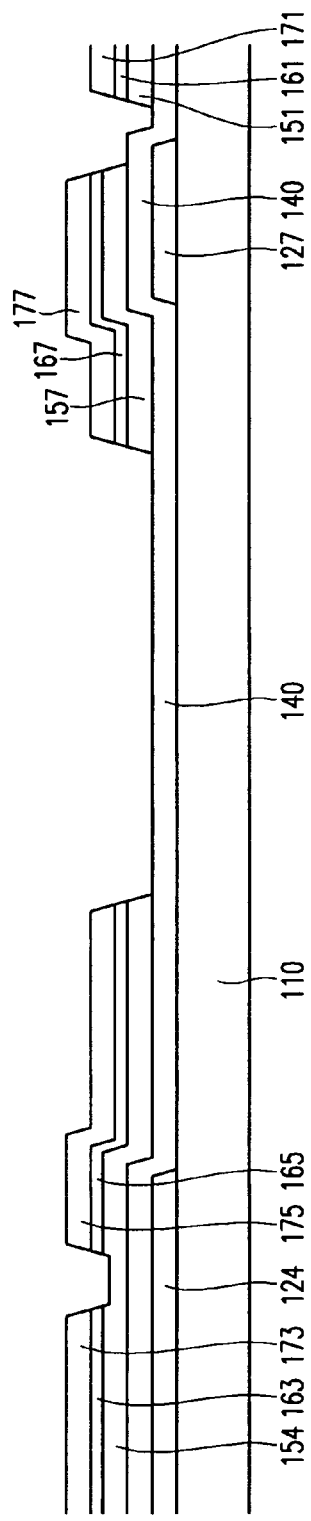
FIG. 7A is a sectional view of the TFT array panel shown in FIG. 6 taken along the line VIIA-VIIA'.
Figure 7B:
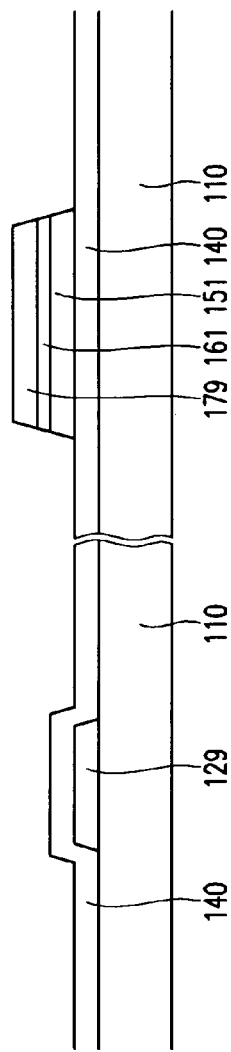
FIG. 7B is a sectional view of the TFT array panel shown in FIG. 6 taken along the lines VIIB-VIIB' and VIIB'-VIIB"
Figure 8A:
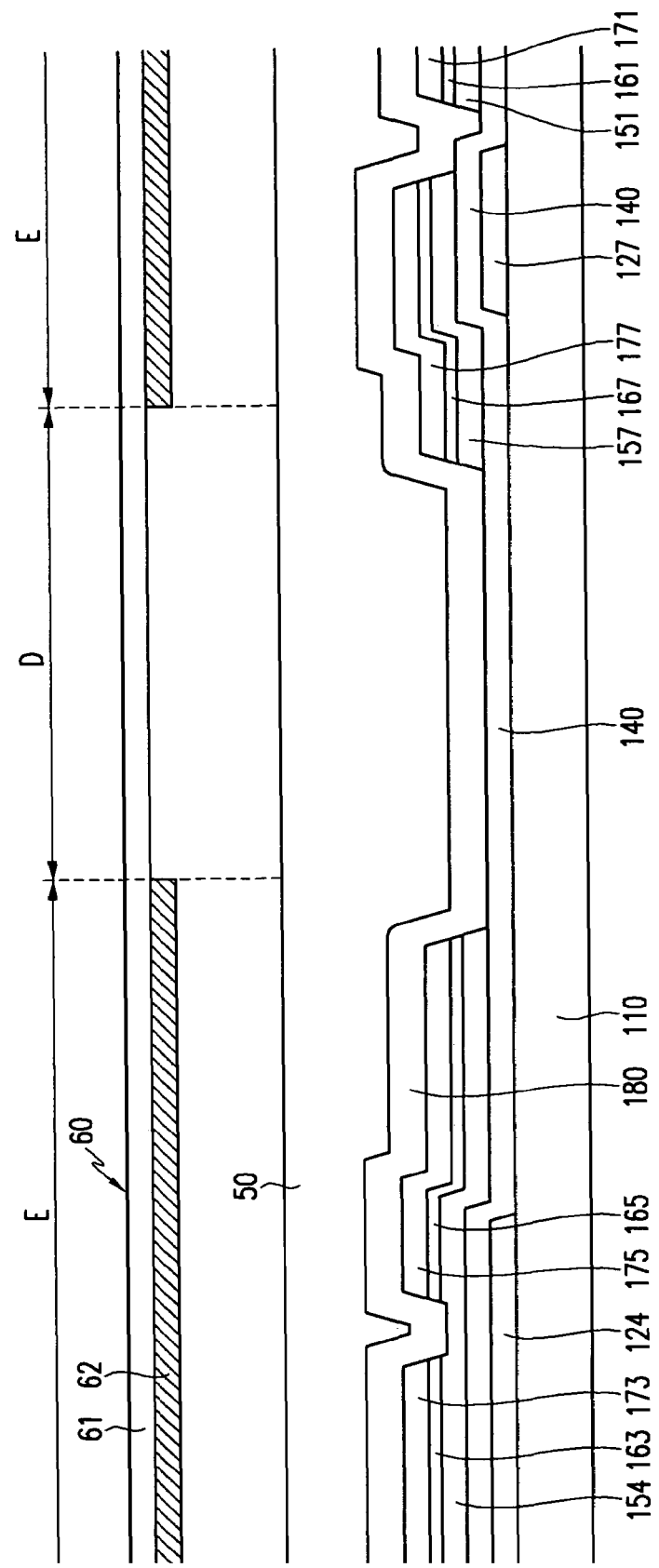
FIGS. 8A and 8B illustrate the step following the step shown in FIGS. 7A and 7B, where
Figure 8B:
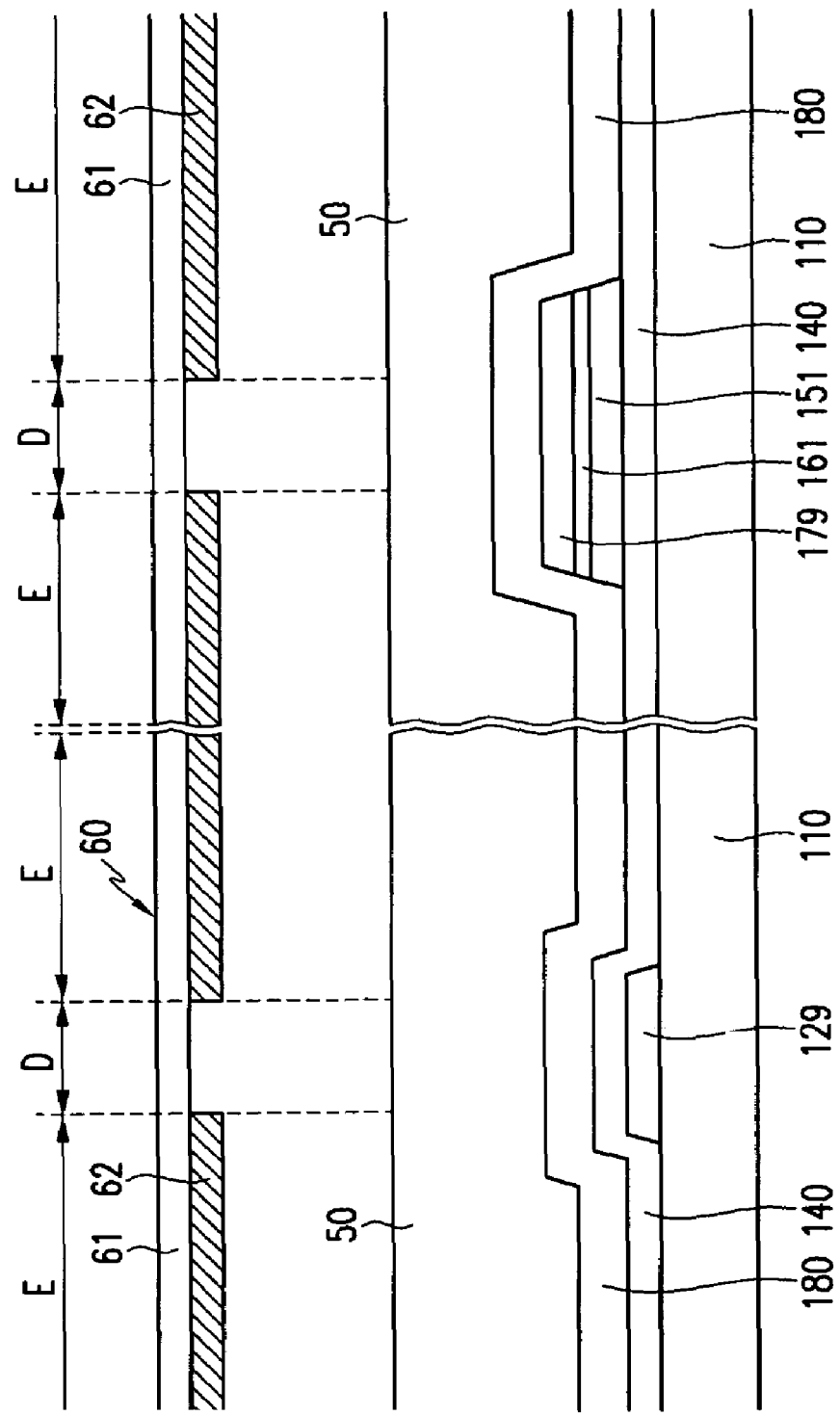
Figure 11A:
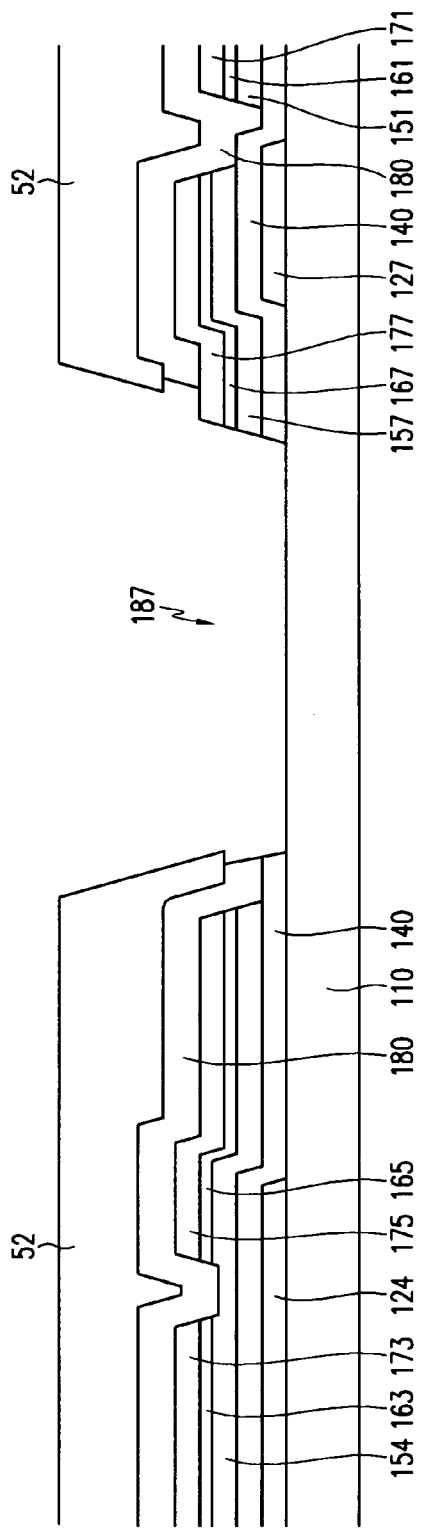
FIGS. 11A and 11B illustrate the step following the step shown in FIGS. 10A and 10B, where
Figure 11B:
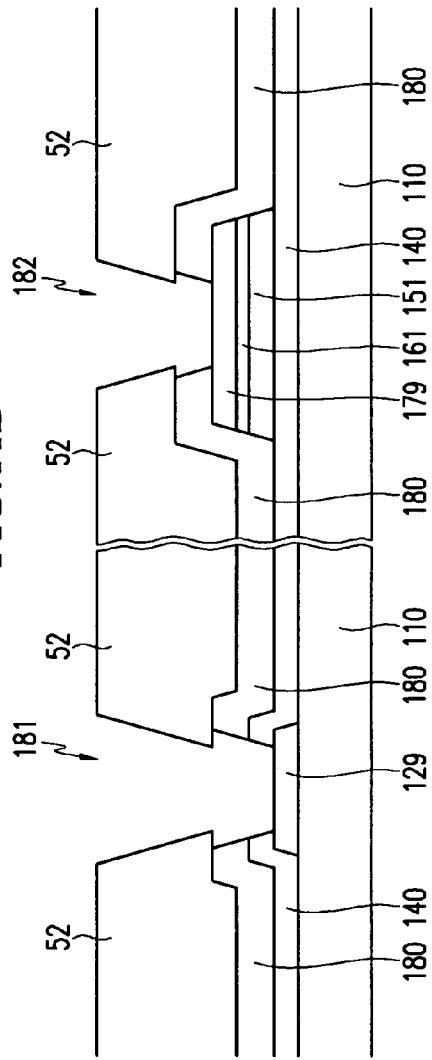
Figure 12A:
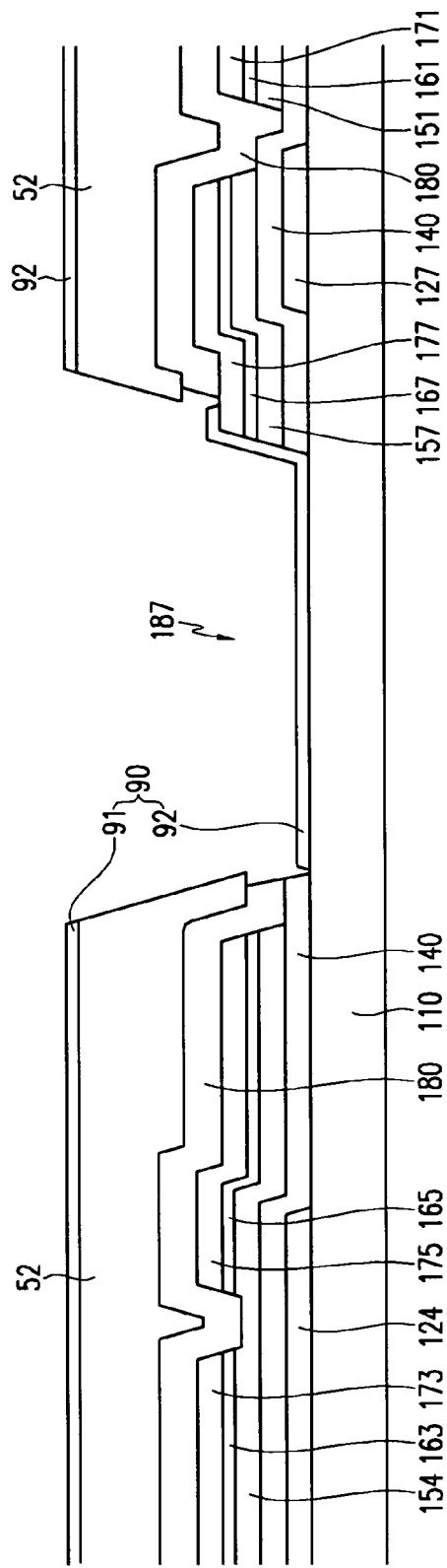
FIGS. 12A and 12B illustrate the step following the step shown in FIGS. 11A and 11B, where
Figure 12B:
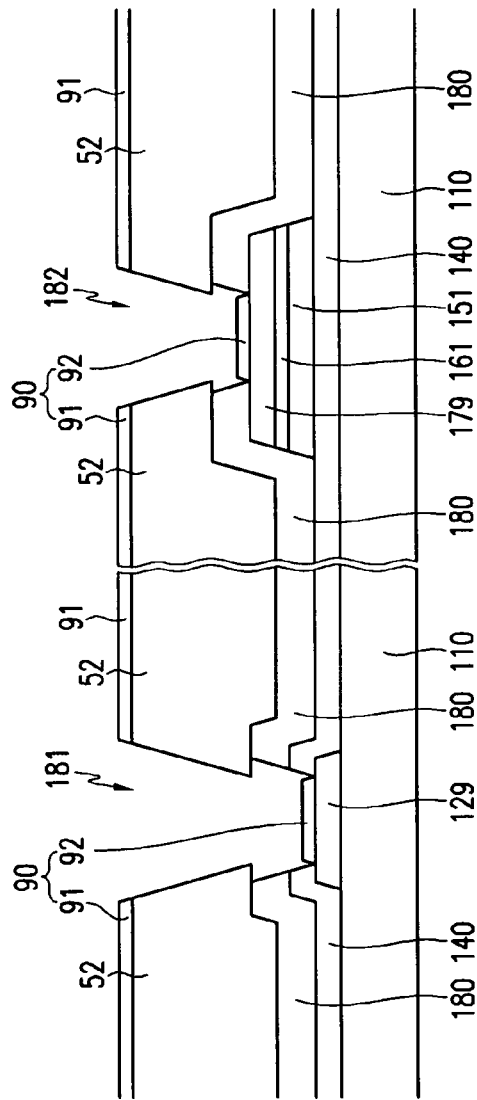

FIGS. 3 and 6 are layout views of a TFT array panel shown in FIGS. 1-2B in intermediate steps of a manufacturing method thereof according to an embodiment of the present invention. FIG. 4A is a sectional view of the TFT array panel shown in FIG. 3 taken along the line IVA-IVA' and FIG. 4B is a sectional view of the TFT array panel shown in FIG. 3 taken along the lines IVB-IVB' and IVB'-IVB". FIGS. 5A and 5B illustrate the step following the step shown in FIGS. 4A and 4B, where FIG. 5A is a sectional view of the TFT array panel shown in FIG. 3 taken along the line IVA-IVA' and FIG. 5B is a sectional view of the TFT array panel shown in FIG. 3 taken along the lines IVB-IVB' and IVB'-IVB". FIG. 7A is a sectional view of the TFT array panel shown in FIG. 6 taken along the line VIIA-VIIA' and FIG. 7B is a sectional view of the TFT array panel shown in FIG. 6 taken along the lines VIIB-VIIB' and VIIB'-VIIB". FIGS. 8A and 8B illustrate the step following the step shown in FIGS. 7A and 7B, where FIG. 8A is a sectional view of the TFT array panel shown in FIG. 6 taken along the line VIIA-VIIA' and FIG. 8B is a sectional view of the TFT array panel shown in FIG. 6 taken along the lines VIIB-VIIB' and VIIB'-VIIB". FIGS. 9A and 9B illustrate the step following the step shown in FIGS. 8A and 8B, where FIG. 9A is a sectional view of the TFT array panel shown in FIG. 6 taken along the line VIIA-VIIA' and FIG. 9B is a sectional view of the TFT array panel shown in FIG. 6 taken along the lines VIIB-VIIB' and VIIB'-VIIB". FIGS. 10A and 10B illustrate the step following the step shown in FIGS. 9A and 9B, where FIG. 10A is a sectional view of the TFT array panel shown in FIG. 6 taken along the line VIIA-VIIA' and FIG. 10B is a sectional view of the TFT array panel shown in FIG. 6 taken along the lines VIIB-VIIB' and VIIB'-VIIB". FIGS. 11A and 11B illustrate the step following the step shown in FIGS. 10A and 10B, where FIG. 11A is a sectional view of the TFT array panel shown in FIG. 6 taken along the line VIIA-VIIA' and FIG. 11B is a sectional view of the TFT array panel shown in FIG. 6 taken along the lines VIIB-VIIB' and VIIB'-VIIB". FIGS. 12A and 12B illustrate the step following the step shown in FIGS. 11A and 11B, where FIG. 12A is a sectional view of the TFT array panel shown in FIG. 6 taken along the line VIIA-VIIA' and FIG. 12B is a sectional view of the TFT array panel shown in FIG. 6 taken along the lines VIIB-VIIB' and VIIB'-VIIB."

Referring to FIGS. 3, 4A, and 4B, a conductive layer preferably made of metal is deposited on an insulating substrate 110 preferably made of transparent glass, by sputtering, etc. The conductive layer may have a thickness of about 1500-5000 Å. The conductive layer is then subjected to lithography and etching to form a plurality of gate lines 121 including gate electrodes 124 and end portion 129. The projection 127 is also formed from the conductive layer.

Referring to FIGS. 5A and 5B, a gate insulating layer 140, an intrinsic a-Si layer 150, and an extrinsic a-Si layer 160 are sequentially deposited by CVD. The gate insulating layer 140 is preferably made of silicon nitride and has a thickness of about 2000-5000 Å. The deposition temperature of the gate insulating layer 140 is preferably in a range of about 250-450° C.

A conductive layer 170 preferably made of metal is then deposited by sputtering, etc., and a photoresist film 40 with a thickness of about 1-2 microns is coated on the conductive layer 170.

The photoresist film 40 is exposed to light through a photo mask (not shown) and developed such that the developed photoresist has a position-dependent thickness. The photoresist shown in FIGS. 5A and 5B includes a plurality of first to third portions in order of decreasing thickness. The first portion of the photoresist located on wire areas A and the second portions located on channel areas B are indicated by reference numerals 42 and 44, respectively. No reference numeral is assigned to the third portion of the photoresist located on the remaining areas C since they have substantially zero thickness and expose the underlying portions of the conductive layer 170. The thickness ratio of the second portions 44 to the first portions 42 is adjusted depending upon the process conditions in the subsequent process steps. It is preferable that the thickness of the second portions 44 is equal to or less than half of the thickness of the first portions 42, and in particular, equal to or less than 4000 Å.

The position-dependent thickness of the photoresist is obtained by several techniques, for example, by providing translucent areas on the exposure mask as well as light transmitting areas and light blocking opaque areas. The translucent areas may have a slit pattern, a lattice pattern, or a thin film(s) with intermediate transmittance or intermediate thickness. When using a slit pattern, it is preferable that the width of the slits or the distance between the slits is smaller than the resolution of the light exposer used for the photolithography. Another example is to use a reflowable photoresist. In detail, once a photoresist pattern made of a reflowable material is formed by using a normal exposure mask with only transparent areas and opaque areas, it is subject to a reflow process to flow onto areas without the photoresist, thereby forming thin portions.

The different thicknesses of the photoresist 42 and 44 enable selectively etching of the underlying layers when using suitable process conditions. Therefore, a plurality of data lines 171 including source electrodes 173 and end portions 179, a plurality of drain electrodes 175, a plurality of storage capacitor conductors 177, a plurality of ohmic contact stripes 161 including projections 163, a plurality of ohmic contact islands 165 and 167, a plurality of semiconductor stripes 151 including projections 154, and a plurality of semiconductor islands 157 are obtained as shown in FIGS. 6, 7A, and 7B by a series of etching steps.

For purposes of description, portions of the conductive layer 170, the extrinsic a-Si layer 160, and the intrinsic a-Si layer 150 on the wire areas A are referred to as first portions. Portions of the conductive layer 170, the extrinsic a-Si layer 160, and the intrinsic a-Si layer 150 on the channel areas B are referred to as second portions, and portions of the conductive layer 170, the extrinsic a-Si layer 160, and the intrinsic a-Si layer 150 on the remaining areas C are referred to as third portions.

An exemplary sequence for forming such a structure is as follows:

(1) Removal of third portions of the conductive layer 170, the extrinsic a-Si layer 160, and the intrinsic a-Si layer 150 on the wire areas A;

(2) Removal of the second portions 44 of the photoresist;

(3) Removal of the second portions of the conductive layer 170 and the extrinsic a-Si layer 160 on the channel areas B; and (4) Removal of the first portions 42 of the photoresist.

Another exemplary sequence is as follows:

(1) Removal of the third portions of the conductive layer 170;

(2) Removal of the second portions 44 of the photoresist;

(3) Removal of the third portions of the extrinsic a-Si layer 160 and the intrinsic a-Si layer 150;

(4) Removal of the second portions of the conductive layer 170;

(5) Removal of the first portions 42 of the photoresist; and (6) Removal of the second portions of the extrinsic a-Si layer 160.

The removal of the second portions 44 of the photoresist is performed either simultaneously with or independently from the removal of the third portions of the extrinsic a-Si layer 160 and of the intrinsic a-Si layer 150. Similarly, the removal of the first portions 42 of the photoresist is performed either simultaneously with or independently from the removal of the second portions of the extrinsic a-Si layer 160. For example, a gas mixture of $SF_6$ and HCl or $SF_6$ and $O_2$ may etch the photoresist and the a-Si layers 150 and 160 with substantially equal etch ratios.

Residue of the photoresist remained on the surface of the conductive layer 170 may be removed by ashing, etc.

Referring to FIGS. 8A and 8B, a passivation layer 180 is deposited and a positive photoresist film 50 is coated. Thereafter, a photo mask 60 is aligned with the substrate 110.

The photo mask 60 includes a transparent substrate 61 and an opaque light blocking film 62, and it is divided into light transmitting areas D and light blocking areas E. The light blocking film 62 is not disposed on the light transmitting areas D but it is disposed on the light blocking areas E. The light blocking film 62 exists in a wide area having a width larger than a predetermined value on the light blocking areas E. As shown in FIG. 8B, the light transmitting areas D are positioned above the end portions 129 of the gate lines 121, the end portions 179 of the data lines 171, the areas enclosed by the gate lines 121 and the data lines 171, and portions of the storage capacitor conductors 177 and the drain electrodes 175. The light blocking areas E are positioned above the remaining portions.

The photoresist 50 is exposed to light through the photo mask 60 and is developed such that portions of the photoresist 50 that receive a predetermined amount of light are removed. Referring to FIGS. 9A and 9B, portions of the photoresist 50 that are aligned with the light transmitting areas D are removed, and portions 52 of the photoresist 50 that are aligned with the light blocking areas E remain.

To maintain the distances (not shown) between the end portions of the drain electrodes 175 and the gate electrodes 124 or the distances "a" between end portions of the storage capacitor conductors 177 and the projections 127 of the gate lines, the end portions of the undercut gate insulating layer 140 is not located behind the end portions of the gate lines 121 when the gate insulating layer 140 is undercut during subsequent processes. That is, the end portions of the undercut gate insulating layer 140 are above the gate electrodes 124 or the projections 127 of the gate lines. Preferably, the projected distance of the gate insulating layer 140 is about 6 μm or more considering the process margins etc. of the gate electrodes 124 or the projections 127 of the gate lines and the drain electrodes 175 or the storage capacitor conductors 177.

Moreover, to maintain the distances (not shown) between the end portions of the remaining photoresist film 52 and the end portions of the drain electrodes 175 or the distances "b" between the end portions of the remaining photoresist film 52 and the end portions of the storage capacitor conductors 177, portions of the drain electrode 175 and the storage capacitor conductor 177 project out of the remaining photoresist film 52 after removal of the passivation layer 180.

As stated above, preferably, the projected distance "b" is about 7.5 μm or more considering the process margins of the drain electrode 124, the storage capacitor conductors 177, and the passivation layer 180, and the undercut of underlying layers of the drain electrodes 175 and the storage capacitor conductors 177 and so on.

Referring to FIGS. 10A and 10B, the passivation layer 180 and the gate insulating layer 140 are etched using the remaining portions 52 of the photoresist 50 as an etch mask to form a plurality of contact holes 181 and 182, and openings 187 exposing the end portions 129 of the gate lines 121, the end portions 179 of the data lines 171, and portions enclosed by the gate lines 121 and the data lines 171, respectively. The openings 187 expose portions of the drain electrodes 175 (although not shown in FIG. 10A) and the storage capacitor conductors 177.

At this time, the remaining photoresist film 52 is not etched. Since the etch rates of the respective layers are different from each other, an undercut is generated under the remaining photoresist film 52 and under the drain electrode 175 and the storage capacitor conductors 177. The relative etch rates are preferable as follows: the passivation layer 180>the drain electrodes 175 and the storage capacitor inductors 177>the semiconductor layers 154 and 157 and the ohmic contact layers 165 and 167>the gate insulating layer 140.

Next, as shown in FIGS. 11A and 11B, the projecting portions (not shown) of the drain electrodes 175 or the projecting portions of the storage capacitor conductors 177 are removed by etching. At this time, portions of the semiconductor layers or the ohmic contact layers under the drain electrodes 175 and the storage capacitor conductors 177 may be partially etched.

When the etching of the projected portions of the drain electrodes 175 or the storage capacitor conductors 177 is subjected to the dry etching, $Cl_2/O_2$-containing gases are used, with which the etch speed of the drain electrode 175 and the storage capacitor conductors 177 is relatively faster than the etch speed of other layers.

In addition, when the projecting portions of the drain electrodes 175 or the storage capacitor conductors 177 are subjected to the wet etching, which generally has a faster etch speed than dry etching, the etch time may be adjusted considering the etch speed of the drain electrode 175 and the storage capacitor conductors 177. Alternatively, chemical wet etching may used to prevent over-undercutting of the drain electrode 175 and the storage capacitor conductors 177.

Referring to FIGS. 12A and 12B, a conductive film 90 preferably made of IZO, ITO, or amorphous ITO is deposited by sputtering, etc.

The conductive film 90 includes first portions 91 disposed on the photoresist 52 and the remaining second portions 92. Since the height difference between the exposed surface and the bottom of the photoresist 52 is large due to the thickness of the photoresist 52, the first portions 91 and the second portions 92 of the conductive film 90 are separated from each other, and the lateral sides of the photoresist 52 are at least partly exposed.

The substrate 110 is then dipped in a developer solution such that the developer solution infiltrates the photoresist 52 through the exposed lateral sides of the photoresist 52 to remove the photoresist 52. At this time, the first portions 91 of the conductive film 90 disposed on the photoresist 52 come off along with the photoresist 52 in a process that is commonly is referred to as a "lift-off." As a result of the lift-off, only the second portions 92 of the conductive film 90 are left to form a plurality of pixel electrodes 190 and a plurality of contact assistants 81 and 82, as shown in FIGS. 1, 2A, and 2B.

At this time, for preventing deterioration of image quality by the difference of capacitances respectively generated between the gate lines 121 and the pixel electrodes 190 and between the drain electrodes 175 or the storage capacitor conductors 177 and the pixel electrodes 190 due to increment of the areas contacted to pixel electrodes 190, the contact areas of the drain electrodes 175 and the pixel electrodes 190 and the contact areas of the storage capacitor conductors 177 and the pixel electrodes 190 are preferably as small as possible. The contact area between the drain electrodes 175 and the pixel electrodes 190 or the contact area between the storage capacitor conductors 177 and the pixel electrodes 190 are preferably about 80 to 120 μm², and more preferably about 100 μm².

The manufacturing method of the TFT array panel according to an embodiment simultaneously forms the data lines 171, the drain electrodes 175, the semiconductors 151, and the ohmic contacts 161 and 165 using a lithography step. A separate lithography step for forming the pixel electrodes 190 and the contact assistants 81 and 82 is not required, and the manufacturing process is thus simplified.

Since the projecting portions of the drain electrodes 175 or the storage capacitor conductors 177 that are formed by the undercut are removed, the disconnection of the pixel electrodes 190 and the drain electrodes 175 and the storage capacitor conductors 177 due to the undercutting is prevented.

Moreover, the process described herein further reduces the manufacturing cost since a separate mask having a slit pattern is not necessary to prevent the disconnection due to the undercut.

As described above, the pixel electrodes and the contact holes connecting the drain electrodes and the pixel electrodes are formed in a single lithography step. Accordingly, a separate lithography step for forming the pixel electrodes is not required, thereby reducing the manufacturing time and cost.

In addition, the disconnection of the pixel electrodes and the drain electrode or the pixel electrodes and the storage capacitor conductors is prevented without a separate mask having a slit pattern.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method of manufacturing a thin film transistor array panel, the method comprising:
    forming a gate line on a substrate;
    forming a first insulating layer on the gate line;
    forming a semiconductor layer on the flint insulating layer;
    forming a conductive layer;
    forming a data line and a drain electrode from the conductive layer and on the semiconductor Layer;
    depositing passivation layer on the data line and the drain electrode;
    forming a photoresist on the passivation layer;
    etching the passivation layer and the first insulating layer using the photoresist as a mask to expose portions of the conductive layer and at least a part of the substrate;
    partially removing an exposed portion of the conductive layer;
    depositing a conductive film on the photoresist, and exposed portions of the conductive layer and the substrate; and
    removing the photoresist and the conductive film deposited on the photoresist, to form a pixel electrode connected to the exposed portion of the drain electrode.

2. The method of claim 1, wherein the photoresist is formed by using a photo mask including a light blocking area and a light transmitting area.

3. The method of claim 1, wherein the removing of the conductive layer comprises dry etching.

4. The method of claim 3, wherein the removing of the conductive layer uses a Cl2/O2-containing gas.

5. The method of claim 1, wherein the removing of the conductive layer comprises wet etching.

6. The method of claim 1, wherein the exposed portion of the conductive layer has a length of at least 7.5 μm.

7. The method of claim 1, wherein a distance between the gate line and the drain electrode is at least 6 μm.

8. The method of claim 1, wherein the exposed portion of the conductive layer has an area range of 80 to 120 μm².

9. The method of claim 1, wherein the etching of the passivation layer and the first insulating layer generates an undercut region under the passivation layer and the first insulating layer.

10. The method of claim 1, wherein forming the data line and the drain electrode comprises forming a storage capacitor conductor overlapping a portion of the gate line.

11. The method of claim 1 further comprising lifting off the conductive film formed on the photoresist.

12. The method of claim 1, wherein the pixel electrode is at least partially connected to the substrate.

13. The method of claim 1, wherein the etching of the passivation layer and the first insulating layer comprises:
    forming a first contact hole exposing an end portion of the data line;
    and
    forming a first contact assistant connected to the end portion of the data line through the first contact hole.

14. The method of claim 13, wherein the etching of the passivation layer and the first insulating layers comprises:
    forming a second contact hole exposing an end portion of the gate line;
    and
    forming a second contact assistant connected to the end portion of the gate line through the second contact hole.

15. The method of claim 14 further comprising forming the pixel electrode along with the first and second contact assistants.

16. The method of claim 1, wherein the semiconductor layer, the data line, and the drain electrode are formed in a single lithography step.

* * * * *